United States Patent
Lin et al.

(10) Patent No.: US 7,474,681 B2
(45) Date of Patent: Jan. 6, 2009

(54) ALTERNATING CURRENT LIGHT-EMITTING DEVICE

(75) Inventors: Ming-Te Lin, Hsinchu Hsien (TW);
Hsi-Hsuan Yen, Hsinchu Hsien (TW);
Wen-Yung Yeh, Hsinchu Hsien (TW);
Ming-Yao Lin, Hsinchu Hsien (TW);
Sheng-Pan Huang, Hsinchu Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 17 days.

(21) Appl. No.: 11/245,255

(22) Filed: Oct. 7, 2005

(65) Prior Publication Data

US 2006/0256826 A1 Nov. 16, 2006

(30) Foreign Application Priority Data

May 13, 2005 (TW) .............................. 94115514 A

(51) Int. Cl.
*H01S 5/00* (2006.01)

(52) U.S. Cl. .................... 372/43.01; 372/45.01; 372/96; 250/221; 250/551

(58) Field of Classification Search ................ 372/50.1, 372/50.12, 50.121, 68, 43.01, 45.01, 96; 250/221, 551
See application file for complete search history.

(56) References Cited

U.S. PATENT DOCUMENTS

| | | | | |
|---|---|---|---|---|
| 5,278,432 | A * | 1/1994 | Ignatius et al. | 257/88 |
| 6,635,902 | B1 * | 10/2003 | Lin | 257/88 |
| 6,797,984 | B1 * | 9/2004 | Lin et al. | 257/82 |
| 6,853,150 | B2 * | 2/2005 | Clauberg et al. | 315/185 R |
| 7,221,044 | B2 * | 5/2007 | Fan et al. | 257/676 |
| 2002/0139987 | A1 | 10/2002 | Collins, III et al. | |
| 2004/0080941 | A1 * | 4/2004 | Jiang et al. | 362/252 |
| 2004/0206970 | A1 * | 10/2004 | Martin | 257/98 |
| 2004/0246696 | A1 | 12/2004 | Yoo | |
| 2005/0001537 | A1 | 1/2005 | West | |
| 2005/0253151 | A1 | 11/2005 | Sakai et al. | |
| 2005/0254243 | A1 * | 11/2005 | Jiang et al. | 362/249 |

FOREIGN PATENT DOCUMENTS

| | | |
|---|---|---|
| DD | 219086 A3 | 2/1985 |
| DE | 10103422 A1 | 8/2002 |
| JP | 5198843 | 8/1993 |
| JP | 07263752 A | 10/1995 |
| JP | 10256597 A | 9/1998 |
| JP | 2004-333583 | 11/2004 |
| TW | 200501464 A | 1/2005 |
| WO | WO 2004023568 A1 | 3/2004 |
| WO | WO 2006030734 A1 | 3/2006 |

* cited by examiner

*Primary Examiner*—Minsun Harvey
*Assistant Examiner*—Yuanda Zhang
(74) *Attorney, Agent, or Firm*—Finnegan, Henderson, Farabow, Garrett & Dunner LLP

(57) ABSTRACT

An alternating current light emitting device and the fabrication method includes forming one or more alternating current micro diode light emitting modules on a substrate, wherein the alternating current micro diode light emitting module has two micro diodes connected to one another, and each micro diode has at least two active layers and is electrically connected by a conductive structure, such that the active layers of each micro diode can take turns emitting light during the positive/negative half cycles of alternating current. A continuous and full-scale light emitting effect is thereby achieved.

9 Claims, 12 Drawing Sheets

ALTERNATING CURRENT LIGHT-EMITTING DEVICE

BACKGROUND OF THE INVENTION

1. Field of the Invention

The present invention relates to a light-emitting device, and more particularly, to an alternating current light emitting device and the fabrication method thereof.

2. Description of Related Art

Unlike white light which is a mixture of different colors, light emitting diodes (LEDs) emit monochromatic light by applying electric current to a radiating material to produce a light described as a cold light since it is produced at a relatively low temperature. Due to the superiority of light emitting diodes in terms of their relative high durability, longevity, portability, low power consumption, absence of harmful substances such as mercury, and so forth, the development of LED-based solid state lighting has become one of the crucial research targets for the global lighting industry as well as the semiconductor industry. Often-seen applications of LEDs include white light illumination (using red, blue, and green LEDs), indicator lights, vehicle signal and illuminating lights, flash lights, LED back-light modules, projector light sources, outdoor displays, and so forth.

White light devices, among the most important lighting applications, still require a patented fabrication process involving fluorescent light. In addition to the necessity of paying royalties, drawbacks include the distribution ratio of fluorescent light and the high color temperature of white light generated by a packaging fabrication process that can lead to decreased operating life and loss of efficacy as a result of the high temperature. Moreover, difficulties in controlling the conventional packaging technique lead to low yield.

Taiwanese Patent Application No. 093126201 discloses a light emitting diode (LED) chip structure having an alternating current circuit, the patent comprising at least one alternating current micro diode LED module formed on a chip and comprised of two micro diode LEDs having a reverse positive/negative parallel connection so as to apply alternating current thereto, such that two micro diode LEDs can, working in turn, emit light during both the positive and negative half cycles of the AC waveform to overcome the drawback of the prior art technique in which devices utilizing that technique emit light during only the positive half cycle but not during the negative half cycle. The invention thereby achieves the objective of fully utilizing alternating current as a power source to significantly expand and upgrade applications of LED elements.

In the foregoing patent, due to the plane array configuration adopted, each micro diode can only emit light during an alternating current half cycle in which the current is flowing in the same direction. In other words, at any particular moment, only half the area of the chip surface can emit light and micro diodes on the other half of the chip surface are non-luminous in an off status. Therefore, in order to obtain the same amount of light that could be obtained if the device constantly emitted light during both half cycles, the amount of electric current has to be doubled.

Further, the micro diode disclosed by said patent has an isosceles, right-angle triangular shape with legs of an approximate length of 70 micrometers each. The design process is difficult if it is necessary to reduce the size of the LEDs to comply with the application trend for product miniaturization. Furthermore, since this patent requires the application of patented sun-second fluorescent powder, the foregoing drawbacks of high color temperature and a hard-to-control packaging process still exist.

Therefore, a need exists to develop a novel alternating current light emitting device that not only improves on the drawbacks of the prior art, but also provides a full-scale light emitting area so as to evenly emit light full time in a way that can be controlled at low color temperature while also exhibiting a higher overlapping area without requiring the use of patented sun-second fluorescent power, thereby decreasing the fabrication difficulties and increasing yield to further enhance the industrial applicability.

SUMMARY OF THE INVENTION

The present invention is accomplished in order to improve the shortcomings disclosed in the prior art. A primary objective of the present invention to provide a novel alternating current light emitting device and the fabrication method thereof that has a full scale light emitting area and also can emit light full time.

Another objective of the present invention is to provide a novel alternating current light emitting device and the fabrication method thereof without requiring the application of patented fluorescent powder.

Another objective of the present invention is to provide a novel alternating current light emitting device and the fabrication method thereof that has a reduced size.

Another objective of the present invention is to provide a novel alternating current light emitting device that can emit light more evenly.

To achieve the above and other objectives, the present invention provides an alternating current light emitting device, the device comprising: a substrate; an alternating current micro diode light emitting module formed on the substrate having at least two micro diodes, each micro diode having at least two active layers; and a conductive structure electrically connected to each micro diode, allowing the active layers of each micro diode to take turns emitting light during the positive and negative half cycles of alternating current.

The foregoing substrate can be a chip or an insulating substrate. The active layer is a luminescent active layer. The conductive structure at least comprises a conductor connecting the two micro diodes such as a conductive bridge network.

Each micro diode and the active layer thereof are electrically connected by a series connection and a parallel connection. Each micro diode can emit light at the same wavelength to thereby emit light of identical colors (monochromatic light), or can emit light at different wavelengths to produce mixed light (multichromatic light). Preferably, each active layer of the micro diode can emit different wavelengths in order to form white light by mixing colors together or form various hues by a combination thereof. Based on the variations of the combination, the same active layer of each micro diode can take turns to emit light during the positive/negative half cycles of alternating current. Alternatively, the different active layers of each micro diode can also take turns to emit light during the positive/negative half cycles of alternating current.

In addition, each micro diode formed on the substrate having at least two active layers can be accomplished by a Flip-Chip, wafer bonding or chip-stacked technique.

To achieve the above and other objectives, the present invention further provides a novel alternating current light emitting device, the device comprising: a substrate; a plurality of alternating current micro diode light emitting modules formed on the substrate, each alternating current micro diode light emitting module having at least two micro diodes, and each micro diode having at least two active layers; and a conductive structure electrically connected to each alternating current micro diode light emitting module and each micro diode so as to cause the active layers to take turns emitting light during the positive and negative half cycles of alternating current.

As described above, at least one active layer of the micro diode is arranged as per the circuit structure of the diodes in a bridge rectifier, and is electrically connected to form one or more bridge light-emitting units. Additionally, the bridge light emitting units can be arranged in the rectangular shape of a matrix, and the number of light emitting units disposed in the central region can be larger than the number of light emitting units disposed in the peripheral regions. Preferably, the arrangement scheme can further comprise disposing the conductive electrodes on the two diagonals of the matrix, and the conductive electrodes and the bridge light emitting units are serially connected to each other for connecting with alternating current.

In accordance with the foregoing, the present invention further provides two fabrication methods for the alternating current light emitting devices disclosed by the present invention. The first method comprises the steps of: preparing a substrate; forming at least two active layers on the substrate; forming a plurality of openings on each active layer respectively; covering the outer periphery of the active layer with a protective layer; forming a plurality of conductive terminals through the protective layer to electrically connect to the active layer; and, lastly, forming a plurality of conductive structures on the openings so as to electrically connect to each active layer, such that application of alternating current to each of the active layers during usage will cause them to take turns emitting light during the positive and negative half cycles of the alternating current.

The second method comprises the steps of: preparing a first substrate; forming a first active layer on the substrate and removing the first substrate and disposing the first active layer on a second substrate; forming a second active layer on the first active layer and forming a connective layer between the first active layer and the second active layer; forming a plurality of openings on the first active layer and the second active layer; covering the outer periphery of the first active layer and the second active layer with a protective layer; forming a plurality of conductive terminals through the protective layer; and, lastly, forming a plurality of conductive structures on the openings so as to electrically connect to the first active layer and the second active layer, such that application of alternating current to the first active layer and the second active layer during usage will cause them to take turns emitting light during the positive and negative half cycles of alternating current.

Additionally, the present invention further provides another alternating current light emitting device, the device comprising: at least a substrate; a bridge light-emitting unit including a plurality of alternating current light emitting diode micro diodes formed on the substrate, the micro diodes being arranged based on the circuit structure of the diodes in a bridge rectifier; and a conductive structure electrically connected to the micro diodes so as to cause them to take turns emitting light during the positive and negative half cycles of alternating current. Preferably, the light emitting device can include a plurality of bridge light emitting units electrically connected to one another, each bridge light emitting unit being arranged in a matrix, wherein the number of the light emitting units disposed in the central region is larger than the light emitting units disposed in the peripheral areas, thereby providing a full-scale light emitting area and an even light emitting effect. Additionally, the light emitting device can include disposing conductive electrodes on the two diagonals of the matrix, the conductive electrodes each being serially connected to each bridge light emitting unit for providing alternating current.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The various objectives and advantages of the present invention can be fully understood by reading the following detailed description with reference made to the accompanying drawings, which are given by way of illustration only, and thus are not limitative of the present invention, and wherein.

DETAILED DESCRIPTION OF PREFERRED EMBODIMENTS

The present invention discloses an alternating current light-emitting device applicable to a chip, the alternating current light-emitting device being capable of generating white light or colored light by externally generated alternating current power, the invention being capable of emitting the white light or colored light full time from the light-emitting surface of the chip, wherein the preferred implementation mode is the general market power according to the universal power standards, the voltage being 110V or 220V and the frequency being 60 Hz or 50 Hz.

Figure 1A:
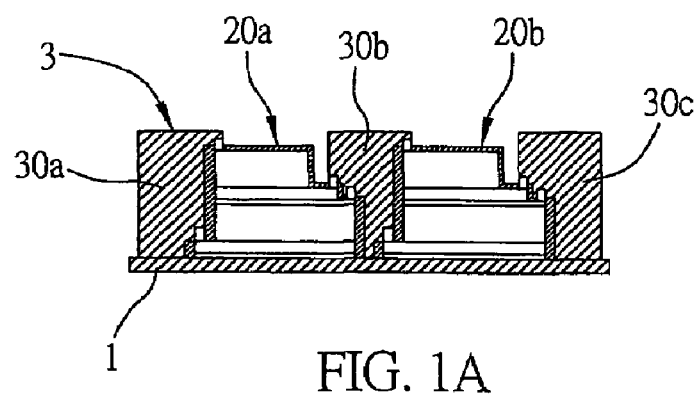
FIGS. 1A and 1B are, respectively, a schematic sectional view and a partially enlarged view of an alternating current light emitting device according to the present invention.
Figure 1B:
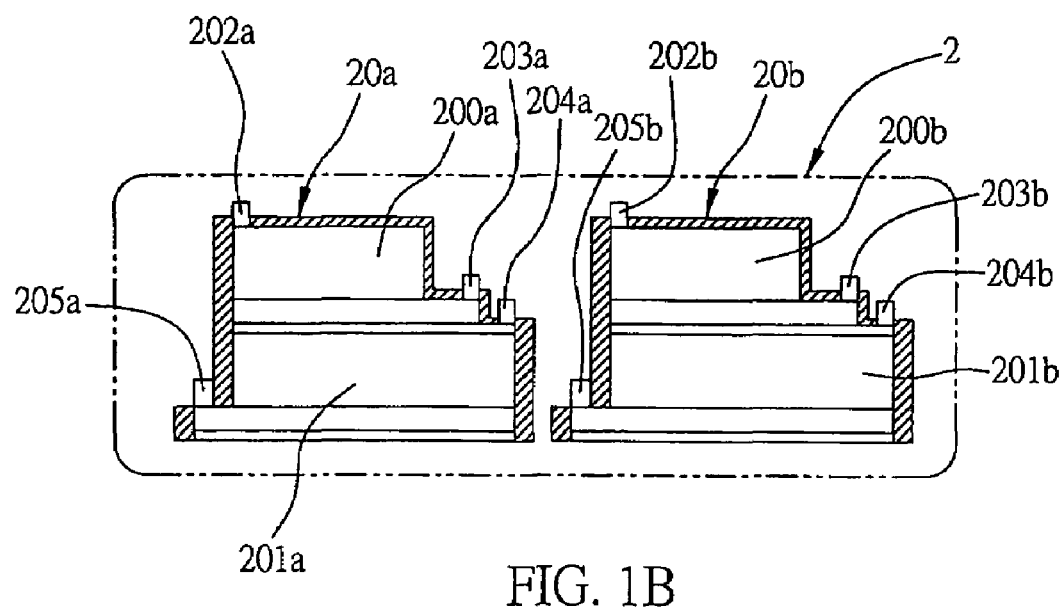

FIGS. 1A and 1B each show a cross-sectional view of the structure of the alternating current light-emitting device of the present invention. The drawings depict only one single alternating current light-emitting device in this preferred embodiment. The alternating current light-emitting device at least comprises a substrate 1, an alternating current micro diode light emitting module 2 formed on the substrate 1, and a conductive structure 3 for providing an electrical connection.

In this preferred embodiment, the substrate 1 can be the chip as mentioned above, or an insulating substrate, such as $Al_2O_3$, GaAs, GaP, SiC, and so forth.

FIG. 1B is enlarged to clearly illustrate the alternating current micro diode light emitting module 2, which comprises at least two micro diodes 20a and 20b which each further comprises at least two active layers, namely, the upper Active layers 200a and 200b and the lower active layers 201a and 201b as shown in the drawing, wherein the active layers are light-emitting active layers, and each active layer of micro diodes 20a and 20b comprises individual ohm electrodes 202a, 202b, 203a, 203b, 204a, 204b, 205a and 205b, such that the active layer can emit light by limiting alternating current by means of these ohm electrodes 202a, 202b, 203a, 203b, 204a, 204b, 205a and 205b. In addition, each micro diode formed on the substrate 1 having at least two active layers can be accomplished by a Flip-Chip, wafer bonding or chip-stacked technique.

The conductive structure 3 is electrically connected to micro diodes 20a and 20b, such that the active layers can take turns to emit light during the positive/negative half cycles of alternating current, wherein the conductive structure 3 at least comprises a conductive body 30b connected between the two micro diodes, as shown in FIG. 1A, the conductive structure 3 further including conductive bodies 30a and 30c for connecting with alternating current, and, in this embodiment, the conductive bodies 30a, 30b, and 30c are preferably a conductive bridge.

Figure 2A:
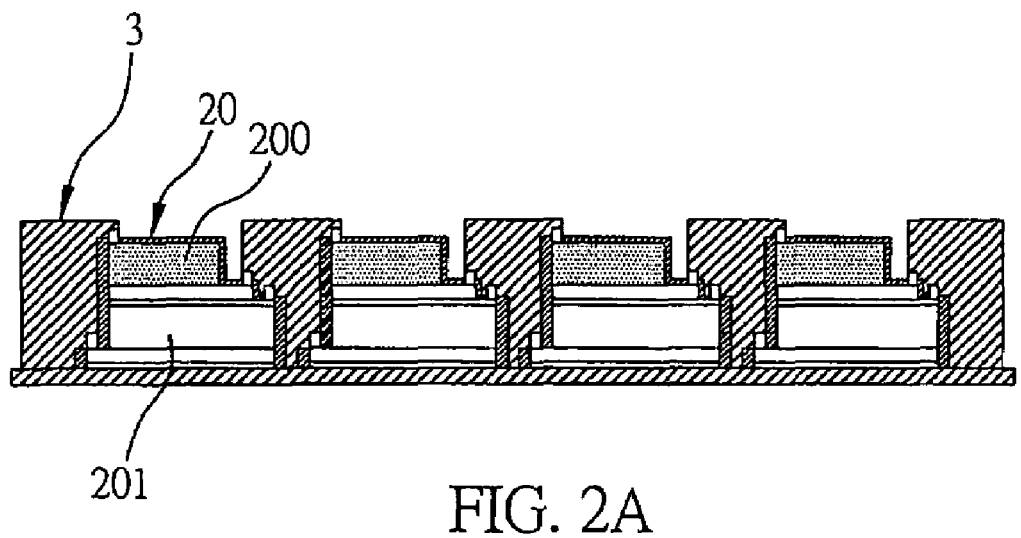
FIGS. 2A and 2B are schematic views illustrating the operation of a preferred embodiment of the alternating current light emitting device according to the present invention.
Figure 2B:
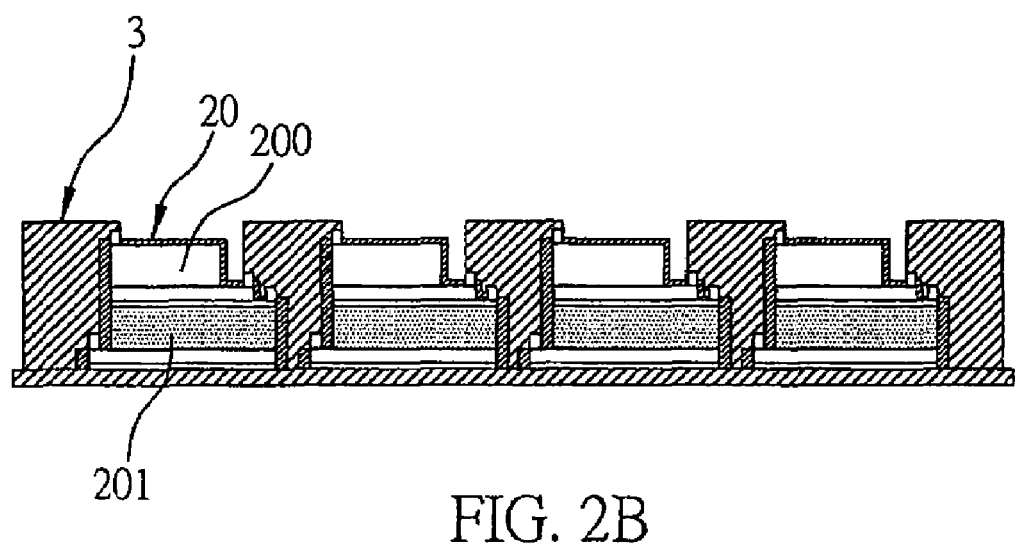
Figure 3A:
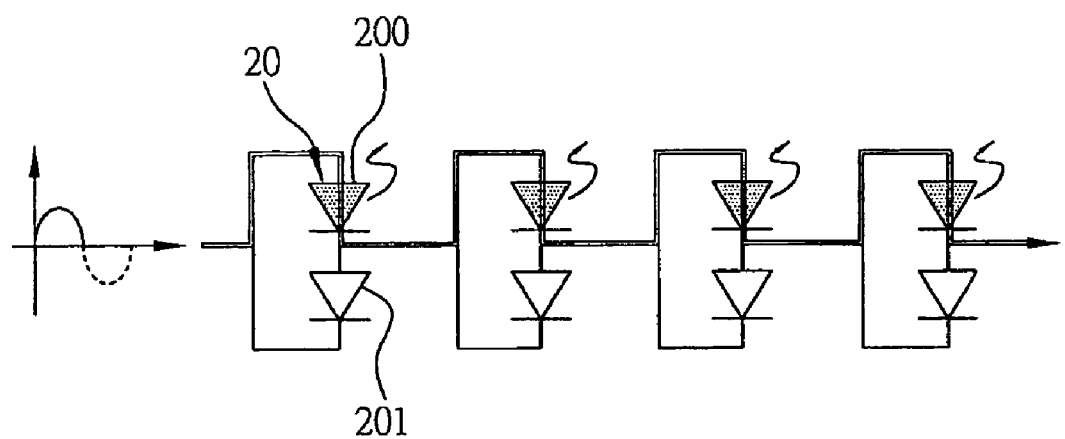
FIGS. 3A and 3B show the respective circuitry of FIGS. 2A and 2B illustrating the operation of a preferred embodiment of the alternating current light emitting device according to the present invention.
Figure 3B:
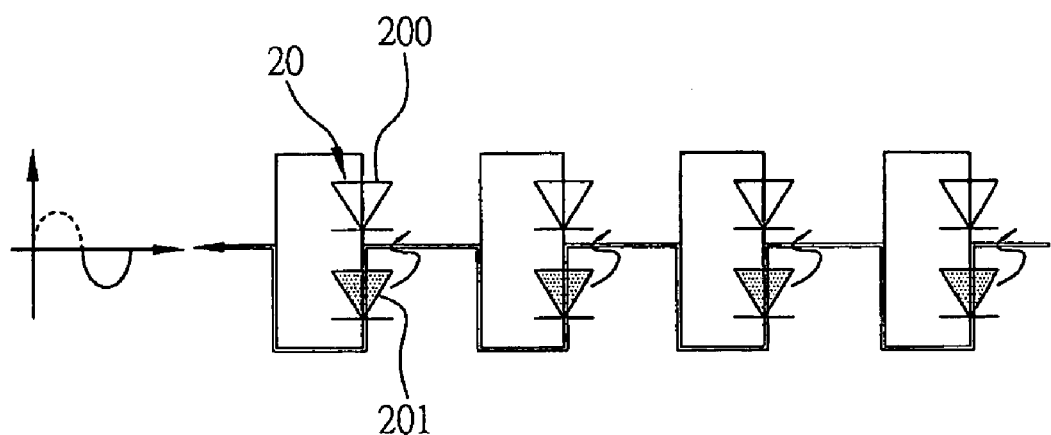

The operation of the alternating current light-emitting device of the invention will be described in the following preferred embodiments with reference to FIGS. 2A and 2B and FIGS. 3A and 3B. FIGS. 2A and 2B show the status of the alternating current light-emitting device being applied with alternating current. FIGS. 3A and 3B are equivalent circuitry of the alternating current light-emitting device, each respectively corresponding to FIGS. 2A and 2B, wherein each active layer is composed of an upper active layer 200 and a lower active layer 201 that are equivalent to light emitting diodes having a P/N structure, thereby forming a serial connection between the upper active layer 200 and the lower active layer 201 of each micro diode 20, and between each of the micro diodes 20 that are electrically connected by the conductive structure 3, as shown in FIGS. 3A and 3B.

FIGS. 2A and 3A each show the radiant status while the positive half cycle of alternating current flows through the alternating current light emitting device. When inputting the positive half cycle of alternating current thereto, the LED structure composed of the upper active layers 200 of the micro diodes 200 is forward biased, and the positive half cycle of current, as shown in an arrow of FIG. 3A, enables the upper active layers 200 to emit light through the upper active layer 200 of micro diodes 20. Similarly, when inputting the negative half cycle of alternating current thereto, the LED structure composed of the lower active layers 201 of micro diodes 200 is forward biased, and the negative half cycle of current, as shown in an arrow of FIG. 3B, enables the lower active layers 201 to emit light through the lower active layer 201 of micro diodes 20. In other words, as can be seen from the equivalent circuitry, the invention is implemented by using two equivalent light emitting diodes (LEDs) overlapping one another for receiving the positive/negative half cycles of alternating current, thereby enabling the alternating current light-emitting device of the invention to emit light when both the positive half cycles and negative half cycles of alternating current flow through the device, and also enabling the same active layers of micro diodes 20 (upper active layer 200 or lower active layer 201) to take turns to emit light by means of the positive and negative half cycles of alternating current.

Figure 4:
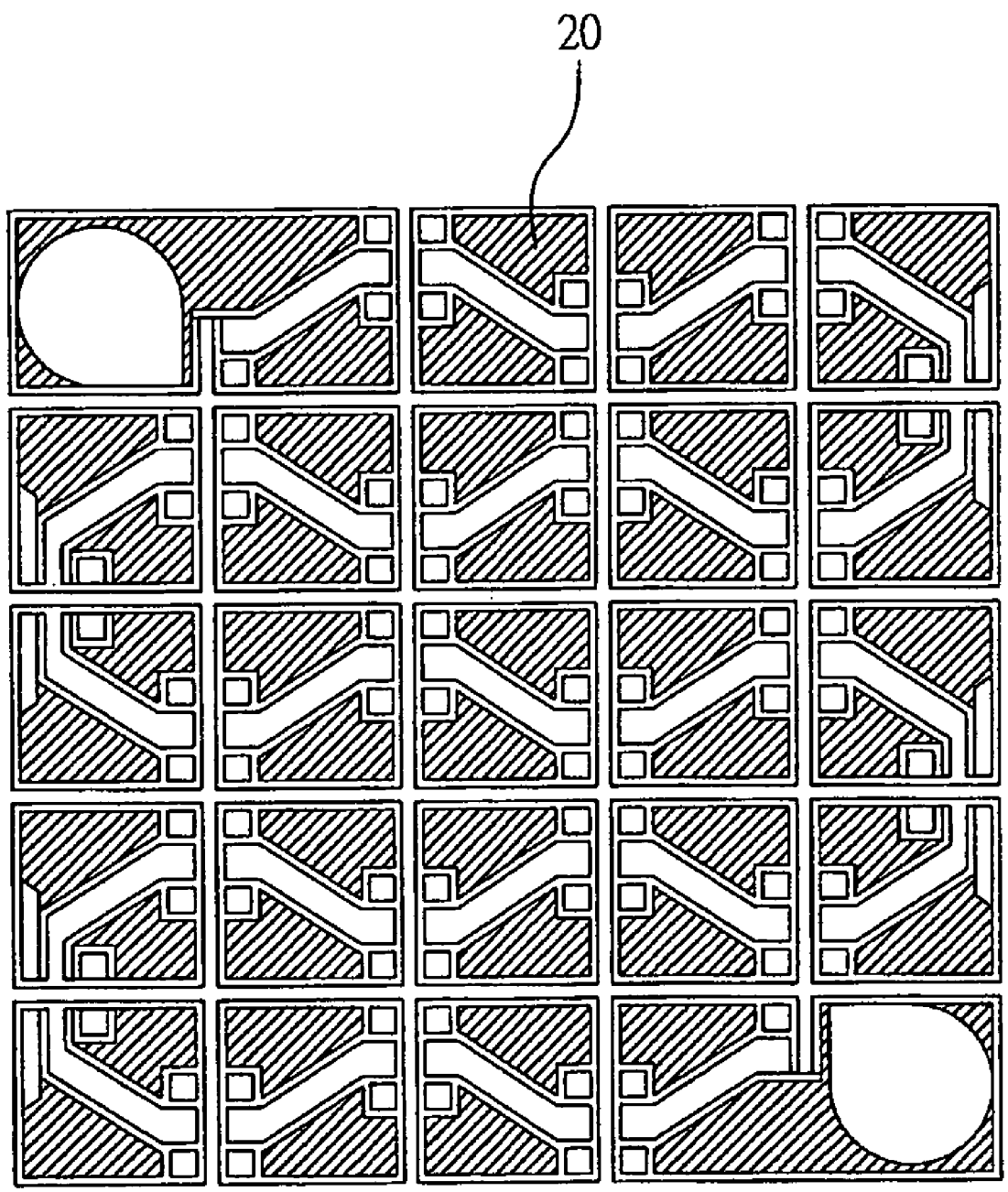
FIG. 4 is a bottom view showing the application of a plurality of the alternating current light emitting devices to a chip according to the present invention.

As shown in FIG. 4, when a plurality of the alternating current light-emitting devices of the invention interlacing one another are staggered and arranged on a chip and applied with alternating current, the light-emitting surface of the chip can take turns to emit light using, for example, a 60 Hz frequency, wherein the micro diodes can have the same or different wavelengths to emit light of the same or different colors (the light being produced in the active layers). If different wavelength characteristics are selected for the micro diodes 20 such that, for example, the upper active layer emits green light and the lower active layer emits red light, then alternating light-emitting of the upper active layer and the bottom active layer can have the effect of mixing light (red light and green light). More specifically, if green light having a wavelength of 485 to 500 nm (for the upper active layer) is used together with red light having a wavelength 580 to 620 nm (for the lower active layer), the interlacing and twinkling light emitted by the upper active layer and the lower active layer is mixed to have an effect similar to white light overlapped with black radiant curves. Accordingly, the present invention not only provides an improved light-emitting device that can emit light continuously, but also provides a device that can be adjusted so as to selectively emit a monochromatic light or mixed colors of light according to the user's implementation and requirements, thereby eliminating the necessity of using fluorescent powder to produce white light. Therefore, the present invention offers advantages over the prior art technique.

Figure 5A:
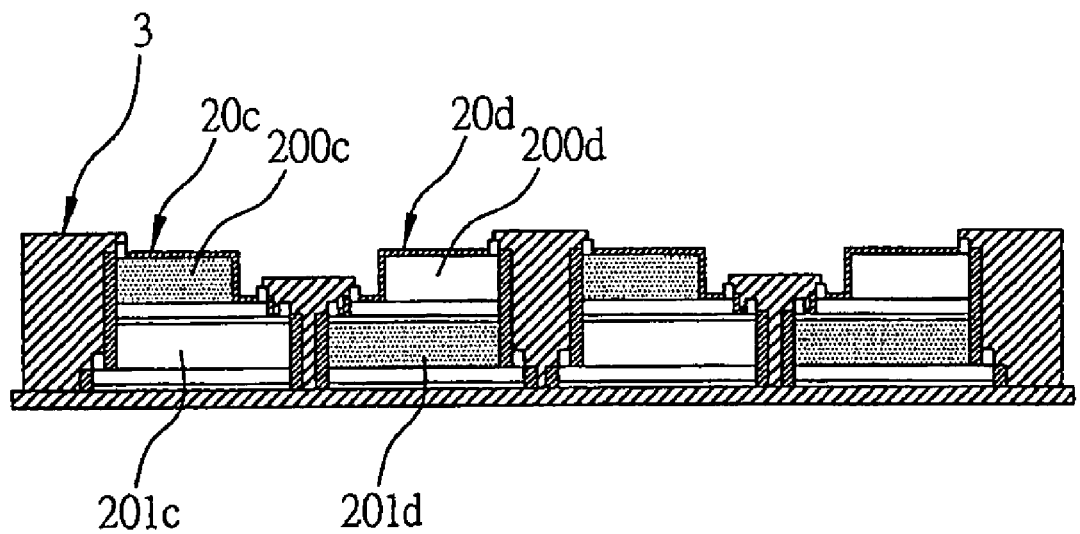
FIGS. 5A and 5B are schematic views showing the operation of the alternating current light emitting device of another preferred embodiment according to the present invention.
Figure 5B:
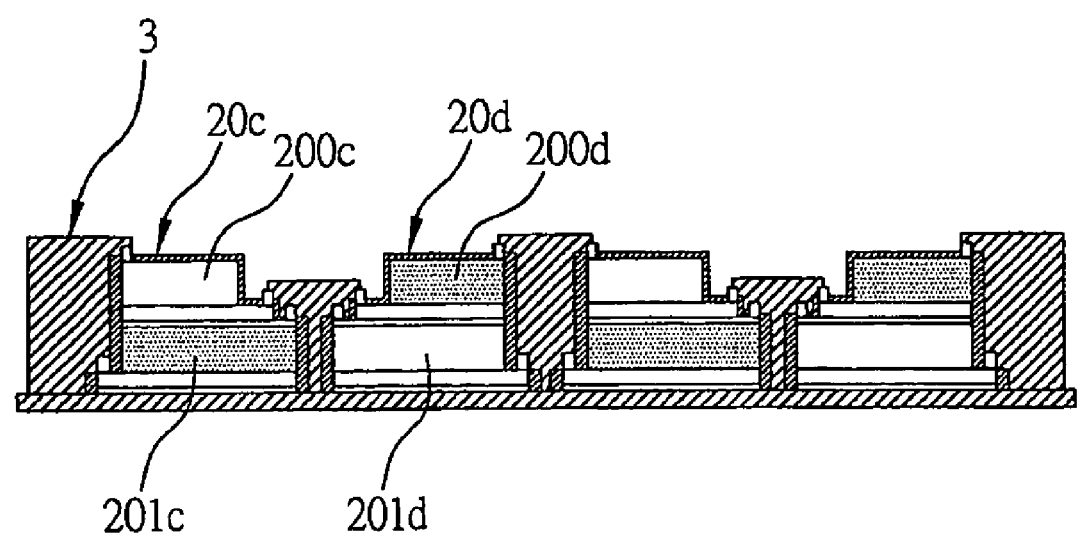
Figure 6A:
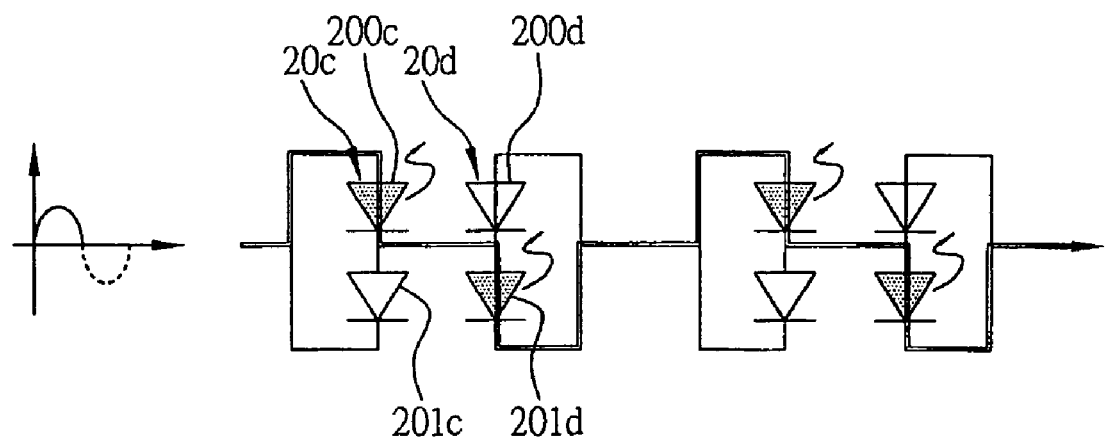
FIGS. 6A and 6B show the respective circuitry of FIGS. 5A and 5B illustrating the operation of another preferred embodiment of the AC light emitting device according to the present invention.
Figure 6B:
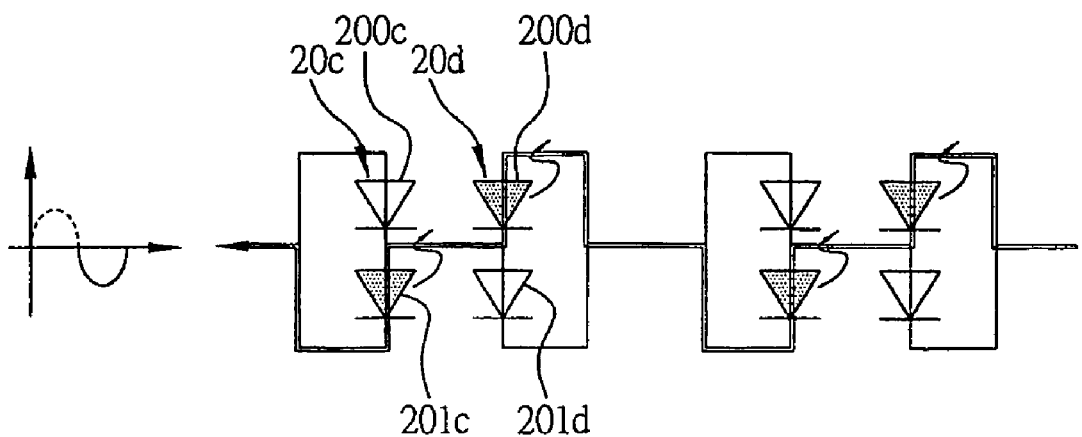

FIGS. 5A and 5B illustrate another application of the alternating current light-emitting device of the invention and the equivalent circuitry thereof shown in FIGS. 6A and 6B, wherein each active layer (comprised of upper active sub-layers 200c and 200d and lower active sub-layers 201c and 201d) is an equivalent to a light emitting diode (LED) having a P/N structure (wherein upper active sub-layers 200c and 200d are of a P structure and lower active sub-layers 201c and 201d are of an N structure), thereby making upper active layers 200c and 200d and lower active layers 201c and 201d of micro diodes 20c and 20d serially connected while the conductive structure 3 is electrically connected to micro diodes 20c and 20d in parallel connection.

FIG. 5A and FIG. 6A each illustrate the radiating status of the alternating current light-emitting device during the positive half cycle of alternating current. During the positive half cycle of alternating current, different active layers of the adjacent micro diodes 20c and 20d are forward biased (namely, the upper active layer 200c of the micro diode 20c and lower active layers 201d of the micro diode 20d). The positive half cycle of alternating current as shown by an arrow in FIG. 6A passes through different active layers of micro diodes 20c and 20d to enable each different active layer to emit light. Similarly, during the negative half cycle of alternating current as shown in FIG. 5B and FIG. 6B, different active layers of the adjacent micro diodes 20c and 20d are forward biased (namely, upper active layers 200d of the micro diode 20d and the lower active layers 201c of the micro diode 20c). The negative half cycle of alternating current as shown by an arrow in FIG. 6B passes through different active layers of micro diodes 20c and 20d to enable each different active layer to emit light. In other words, as it can be seen from the equivalent circuitry, the preferred embodiment is implemented using two identical light emitting diodes stacked together in an upper/lower manner for receiving the positive/negative half cycles of alternating current, such that the alternating current light-emitting device of the invention can emit light when either the positive or negative half cycles of alternating current are applied thereto. It differs from the applications depicted in FIGS. 2A, 2B, 3A and 3B in that the different active layers of the micro diodes 20c and 20d take turns to emit light during the positive/negative half cycles of alternating current. A plurality of alternating current light emitting devices employed in this embodiment are interlacingly arranged on a chip to receive alternating current that empowers the light emitting surface of the chip to emit light continuously.

Similarly, the micro diodes 20c and 20d as described above can have the same or different wavelengths (each active layer can also have the same or different wavelengths) in order to emit light of identical or different colors, wherein if micro diodes 20c and 20d emit different wavelengths, such as the upper active layers 200c and 200d emit green light and the bottom active layers 201c and 201d emit red light, the alternating of the light emitting from the different active layers (upper active layer 200c—bottom active layer 201d or upper active layer 200d to bottom active layer 201c) can achieve the effect of mixing colored light (such as red light plus green light, the application thereof is the same as the foregoing embodiment and thus will not be further detailed herein). Additionally, since the upper active layers 200c and 200d and the bottom active layers 201c and 201d are capable—depending on fabrication—of emitting light of different colors at a pulsating, light-emitting frequency of 120 Hz (60 Hz×2) that practically exceeds the highest frequency 100 Hz that is recognizable by human vision, then this has the visual effect of mixing light more evenly or softly to provide for an optimal visual effect. Accordingly, the continuous light emitting device employed in this embodiment not only can comply with users' needs to flexibly allocate colors of emitting light but also can produce more even and soft light for optimal visual effects.

Figure 7:
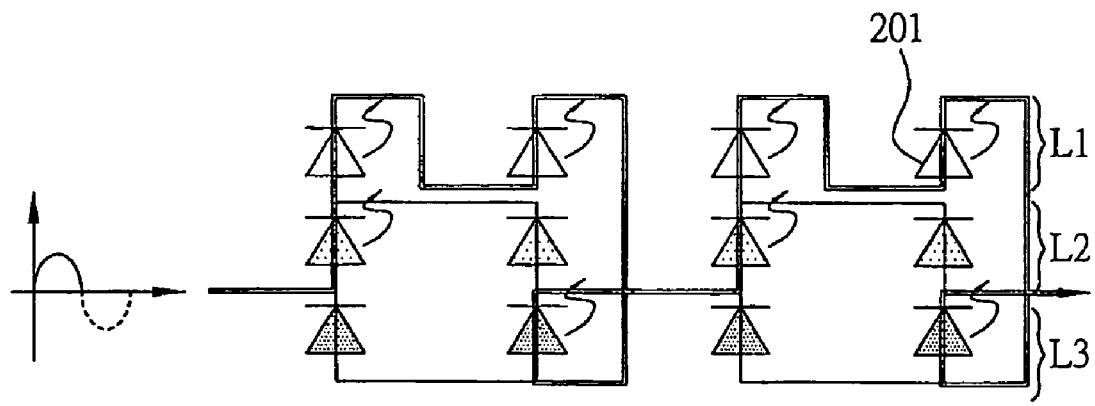
FIG. 7 is a three-layer equivalent circuitry showing a plurality of the alternating current light emitting devices of the present invention.

In the case that the alternating current light emitting device of the present invention is a structure having three active layers—a preferred embodiment shown in FIG. 7 illustrates an equivalent circuitry adding one active layer as described above and one equivalent light emitting diode—more colors are possible. When inputting the positive half-cycle of alternating current as shown by an arrow, each active layer conducting the positive half-cycle of current will emit light (the current passing route of the negative half-cycle of alternating current can be easily discerned from the positive half-cycle of current and thus is not further detailed herein). A preferred embodiment of this three-layer structure is implemented by having a first layer L1 to emit green light that is the most essential color for producing white light due to the way the human eye poorly responds to light of green frequency, having a second layer L2 to emit blue light that is the next most essential color for producing white light, and having a third layer L3 to emit red light that is the third most essential color for producing white light. Based on FIG. 7, the colors produced during the positive half cycle of alternating current appear in the order (following the arrow from left to right) of blue, green, green, red, blue, green, green, red. The colors produced during the negative half cycle of alternating current also appear in the same order of blue, green, green, red, blue, green, green, red, but this time current flows from right to left to utilize the two blue and two red diodes that didn't conduct during the positive half-cycle (all of the green diodes emit light during the negative half-cycle just as during the positive half-cycle since, as mentioned, the human eye needs more green mixed in order to perceive white). Therefore, the alternating current light emitting device of the invention can employ and match different colors to achieve an overall desired color effect when the positive or negative half cycles of alternating current are applied to the active layers thereof. Also, in order for this three-layer structure to have the effect of producing white light (by mixing colors of emitted light), a preferable application is to mix green light at a 535 nm wavelength with blue light at a 460 nm wavelength and red light at a 630 nm wavelength. It should be added that when three or more active layers are used to mix light, adjustments in color temperature are required, for example, one or more active layers can be made nonluminous by applying short circuits to meet the light mixing requirements in practical use.

Figure 8:
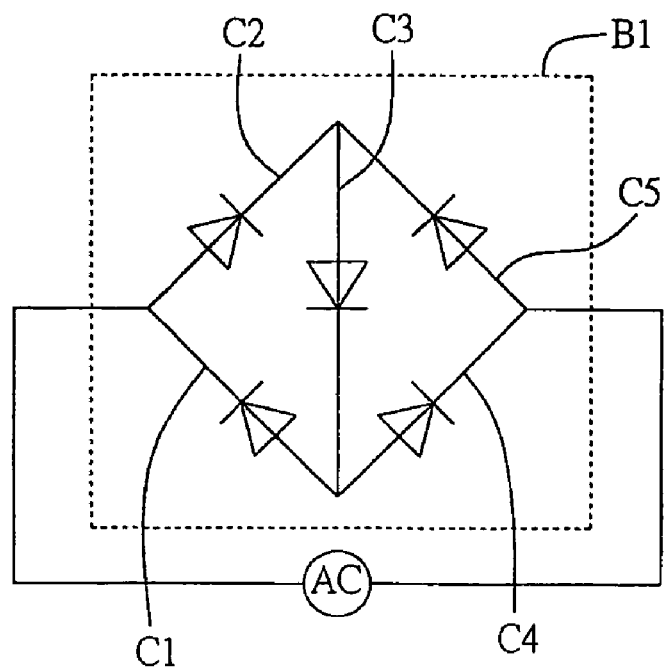
FIG. 8 shows the basic circuitry showing the micro diodes of the plurality of the alternating current light emitting devices of the present invention having at least one active layer with diodes being arranged according to the circuit configuration diodes in a Bridge Rectifier.

Furthermore, as shown in FIG. 8, the one or more active layers of the micro diode disclosed in the invention can be configured using the circuit structure of diodes configured in a bridge rectifier configuration, wherein each active layer is electrically connected (one active layer as described above that is an equivalent of a light emitting diode). An optimal application of this light-mixing effect is to mix colors of two or three layers (wherein the preferred color mixing applications for two or three layers are the same as that described above and thus will be omitted herein).

Figure 9A:
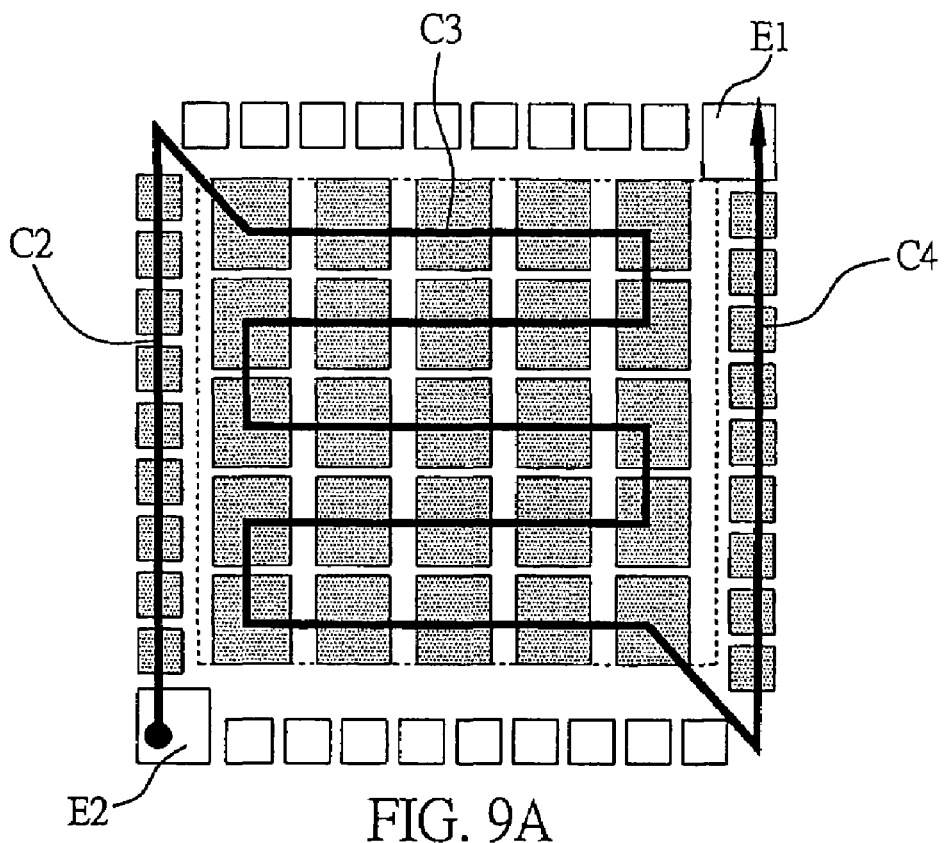
FIGS. 9A and 9B are, respectively, schematic diagrams showing the application of each half cycle of alternating current to a chip according to the circuit configuration of the preferred embodiment depicted in FIG. 8.
Figure 9B:
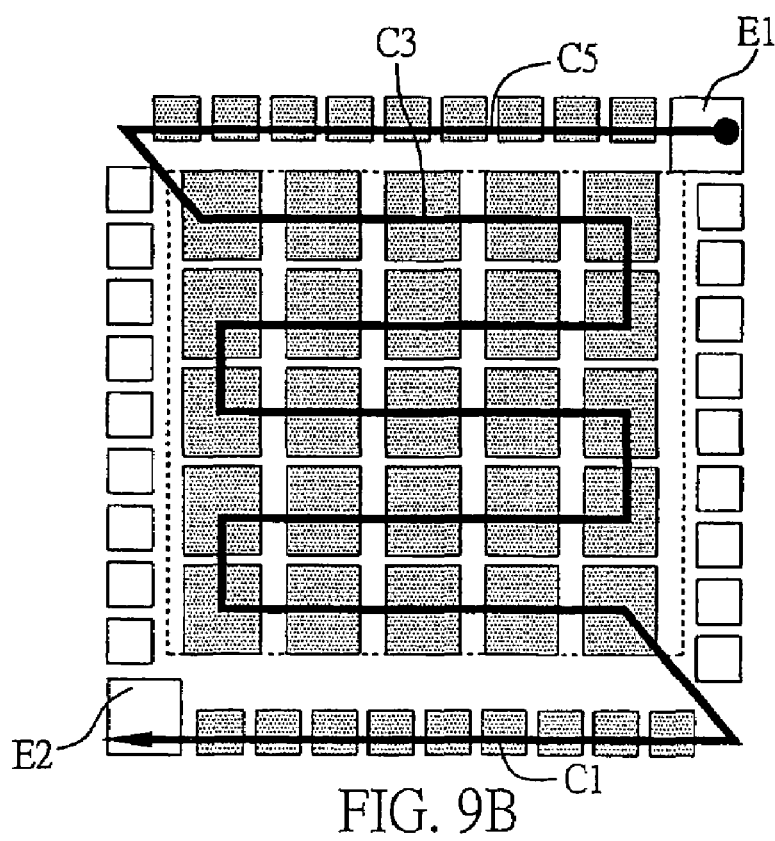
Figure 10A:
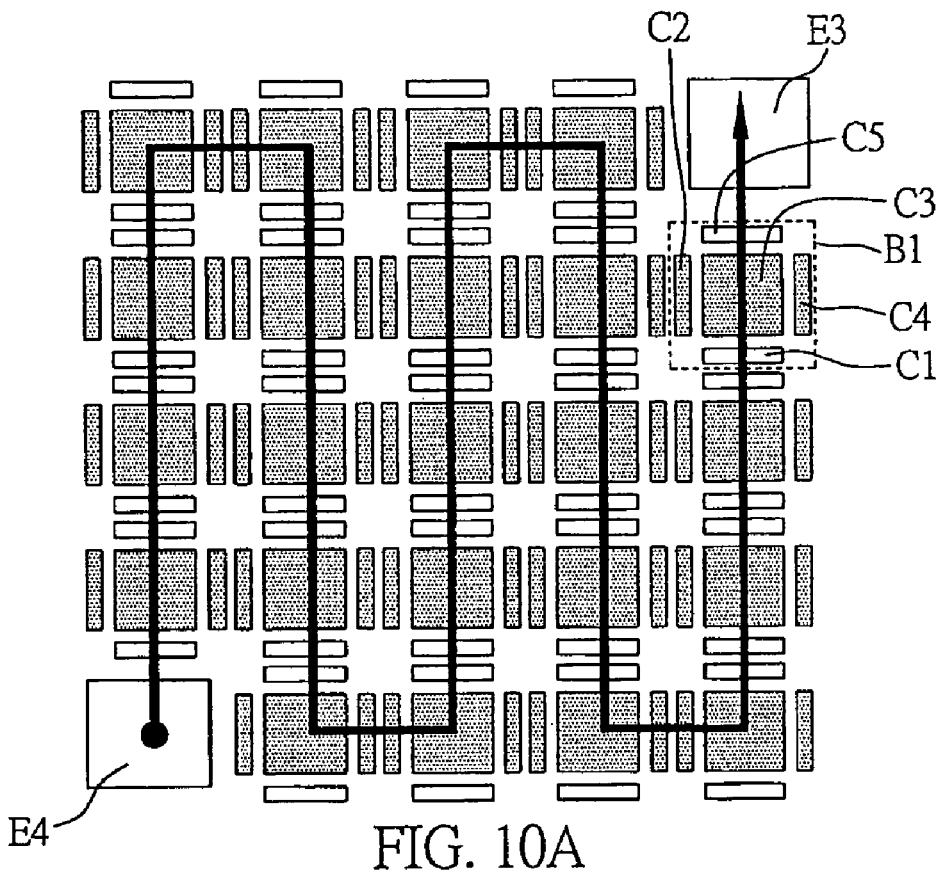
FIGS. 10A and 10B are, respectively, schematic diagrams showing the application of each half cycle of alternating current of half waves to a bridge rectifier with a plurality of bridge light emitting units to a chip using the circuit configuration of the preferred embodiment depicted in FIG. 8.
Figure 10B:
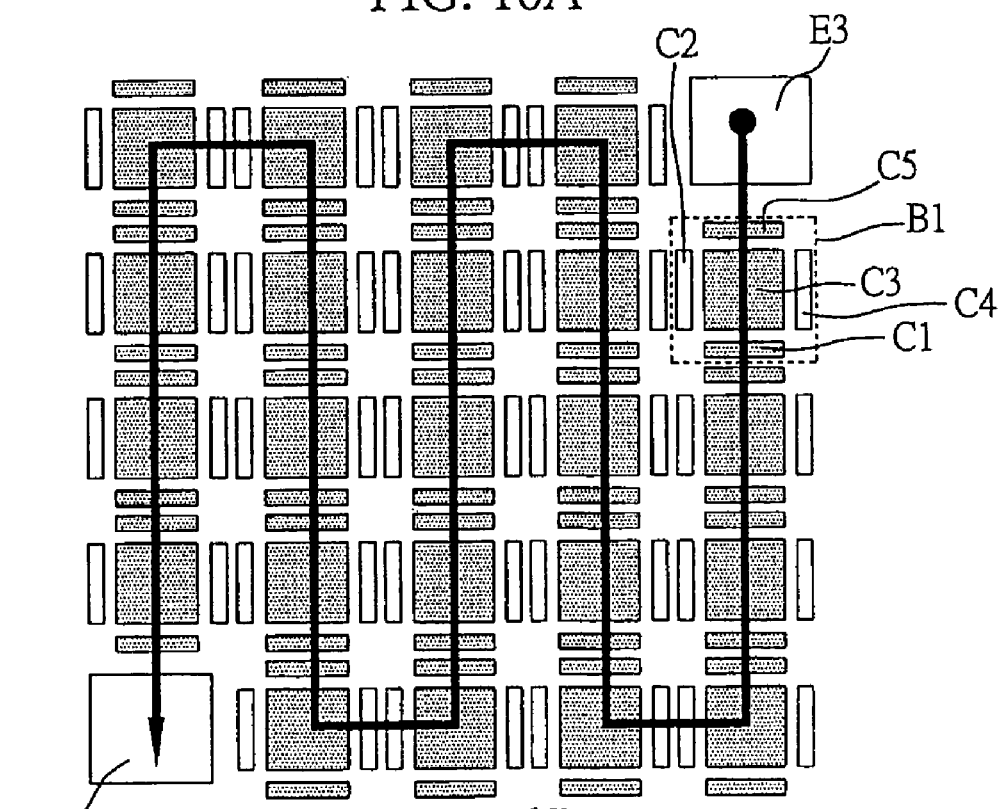

Also, as illustrated in FIG. 8, each of the electrically connected circuits arranged as per the foregoing circuit structure is defined as a first circuit C1, a second circuit C2, a third circuit C3, a fourth circuit C4 and a fifth circuit C5 for illustration purposes, wherein the light emitting colors and number of each active layers (an equivalent to a light emitting diode) can be decided by the users depending on the requirements. A preferred embodiment is to respectively dispose 10 active layers of the micro diodes on the first circuit C1, the second circuit C2, the fourth circuit C4, and the fifth circuit C5, and disposing 22 active layers of the micro diodes on the third circuit C3, wherein each alternating current light emitting micro diode has one or more active layers. The number of the active layers taking the alternating current reverse bias voltage in this kind of circuit structure arrangement is about half of the number of the active layers taking the alternating current forward bias voltage, therefore, if this structure uses a plurality of active layers to concurrently take the reverse bias voltage of alternating current, the reverse bias alternating current voltage will be evenly absorbed (one active layer can take about 10-15 volts of reverse bias voltage) so as to prevent shorting or break-down that may occur due to breaking the active layers from excessive reverse bias voltage. Also, the foregoing embodiment can be implemented to achieve the effect of mixing colors to produce white light. The figure showing this embodiment is characterized in that, in addition to the fact that light emitting diodes differing colors may be used and that the number of the active layers can be flexibly decided, the configuration of the second circuit C2, the third circuit C3 and the fourth circuit C4 as shown in FIG. 9A conducting the positive half cycle of alternating current, and the configuration of the fifth circuit C5, the third circuit C3 and the first circuit C1 conducting the negative half cycle of alternating current as shown in FIG. 9B, are employed to dispose the third circuit to conduct both the positive and negative half cycles of alternating current on the light emitting surface of a chip, thereby achieving the effect of continuous light emitting when the conductive electrodes E1 and E2 on the major light emitting area of the chip surface are connected with alternating current (said conductive electrode E1 and E2 are electrically connected to the circuit). As the plurality of active layers of the micro diodes of the third circuit C3 can emit light during either the positive or negative half cycles of alternating current, the number of active layers used in prior art techniques can be reduced. For example, the number of active layers used in prior art techniques requires 22 layers for each of the positive and the negative half cycles of alternating current, making a total number of 44, while, in the present invention, only a total number of 22 active layers are required to achieve the effect of continuous light emitting;

Furthermore, the circuit configuration of the foregoing active layers (equivalent to LEDs) of the micro diode can also be a bridge light-emitting unit B1 as shown in FIG. 8, that is, one or more active layers of a micro diode of a bridge light-emitting unit B1 is arranged as per the diodes in a bridge rectifier to electrically connect to one another. A plurality of bridge light-emitting units B1 arranged in a matrix as shown in FIGS. 10A and 10B is disposed on the light emitting surface of a chip, the two diagonal corners of the matrix being disposed with two conductive electrodes E3 and E4 for connecting with alternating current (the two conductive electrodes E3 and E4 being serially connected with the bridge light-emitting unit B1), such that when connected to alternating current, the current of the positive or negative half cycles passes through most parts of the light emitting surface of the chip to emit light continuously;

The circuit configuration as described above can also be applied to an alternating current light emitting device composed of micro diodes having a single active layer, such as forming bridge light emitting units composed of a plurality of alternating current light emitting diodes on a substrate, the circuit configuration of micro diodes being arranged as per the diodes in a bridge rectifier and being electrically connected to each micro diode through a conductive structure, thereby making the micro diodes to take turns to emit light during the positive and negative half cycles of alternating current. Alternatively, it can include a plurality of bridge light emitting units electrically connected to one another, each bridge light emitting unit being disposed as a part of a matrix, wherein the number of the bridge light emitting units in the central region is larger than that in the peripheral region to thereby achieve a continuous and more even light emitting effect. Additionally, it further includes a step of disposing two conductive electrodes on the two diagonal corners of the matrix, each conductive electrode being serially connected to each bridge light emitting unit to provide connection of alternating current. Since the circuit structure thereof is similar to that described above, thus it will not be further detailed herein.

The active layers (an equivalent to a LED as mentioned above) disclosed by the present invention do not require any externally-added load in order to apply AC power directly to the relative circuits of the blocking or indicating circuits, and also it can have a plurality of active layers being in configured in a parallel connection and then can be serially connected to each other so as to have different lighting applications. Moreover, the active layers can be applied to LCD Backlight devices as disclosed by USP 2005001537, USP 2004246696, and JSP 2004333583. The active layers can also be implemented by a variety of manufacturing processes, such as the LED conducting wire stand glue-irrigating packaging process; the Super Flux conducting wire stand glue-irrigating packaging process; the Flip-Chip, ceramics and aluminum substrate manufacturing processes; the PPA point-gluing, injection packaging process; or the To metal shell packaging process, and so forth.

Figure 11A:
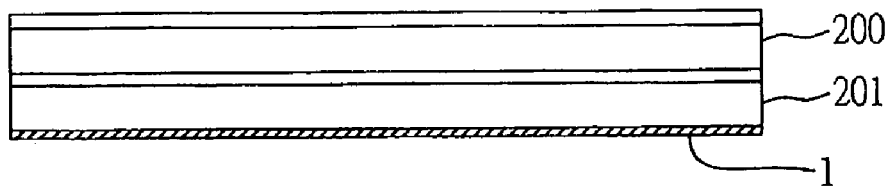
FIGS. 11A through 11E are structural flowcharts showing, collectively, a fabrication method of the alternating current light emitting devices of the present invention.
Figure 11B:
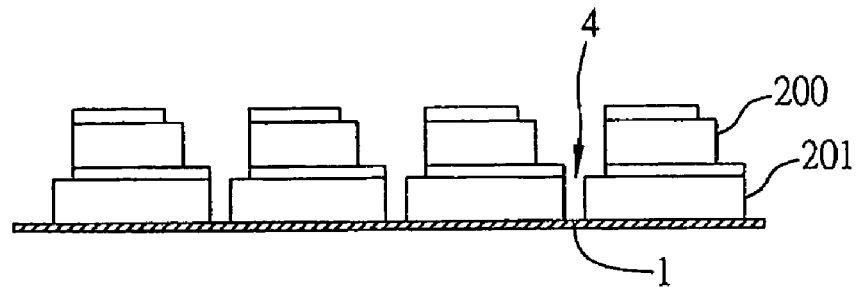
Figure 11C:
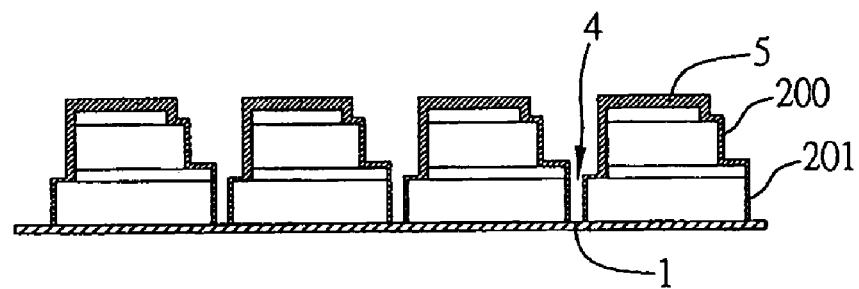
Figure 11D:
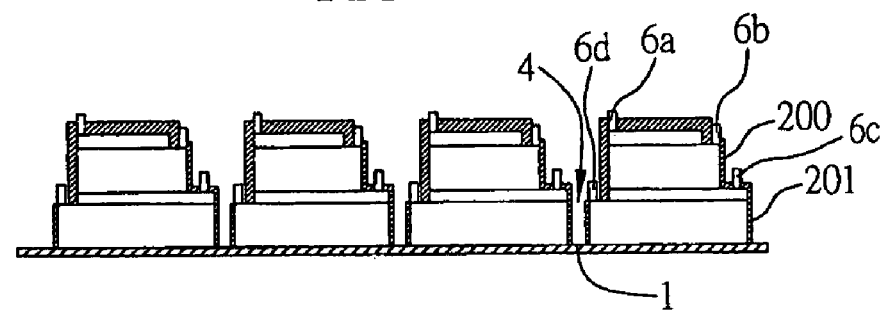
Figure 11E:
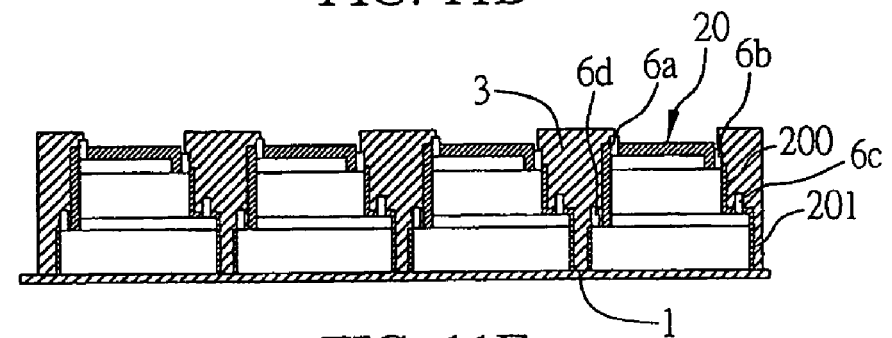
Figure 12A:
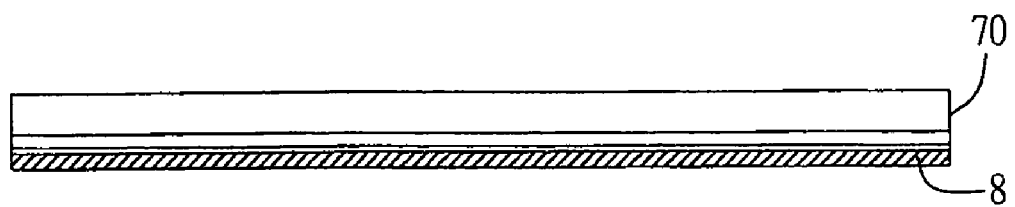
FIG. 12A through 12F are structural flowcharts showing, collectively, another fabrication method of the alternating current light emitting devices of the present invention.
Figure 12B:
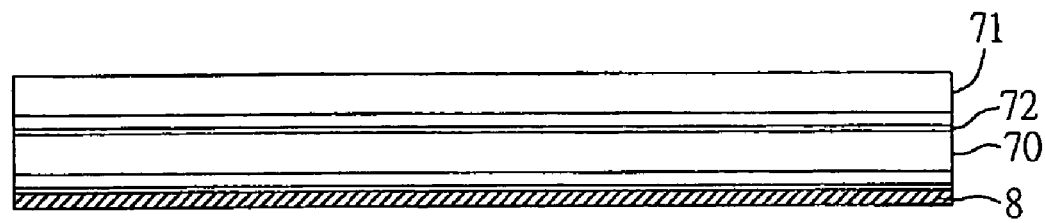
Figure 12C:
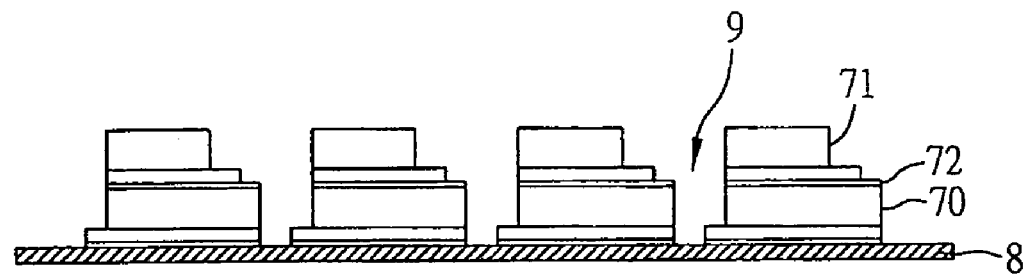
Figure 12D:
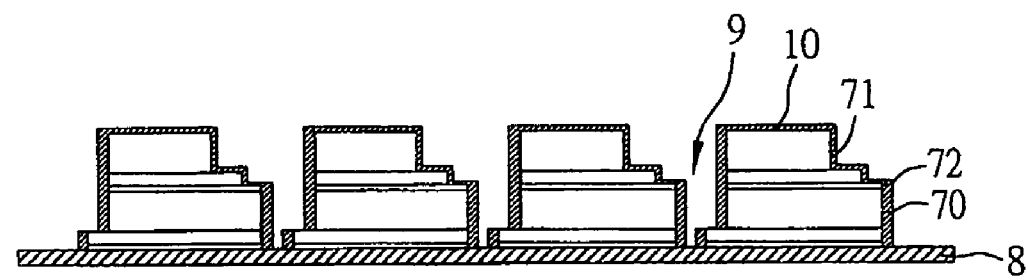
Figure 12E:
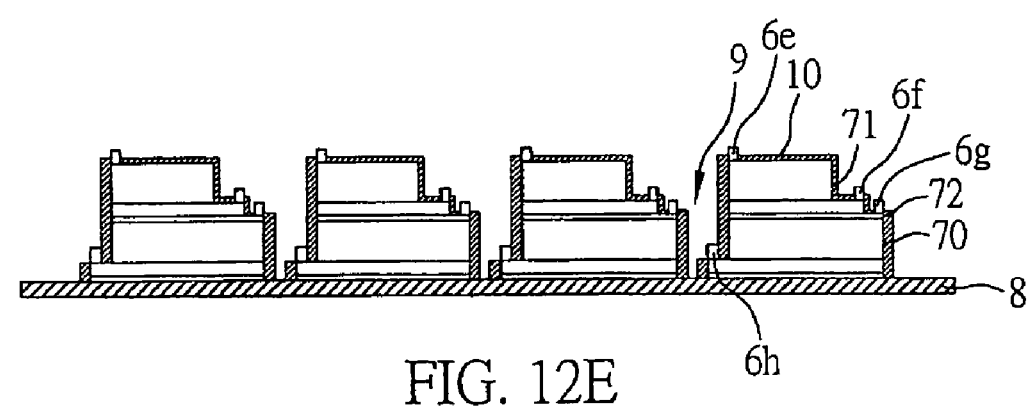
Figure 12F:
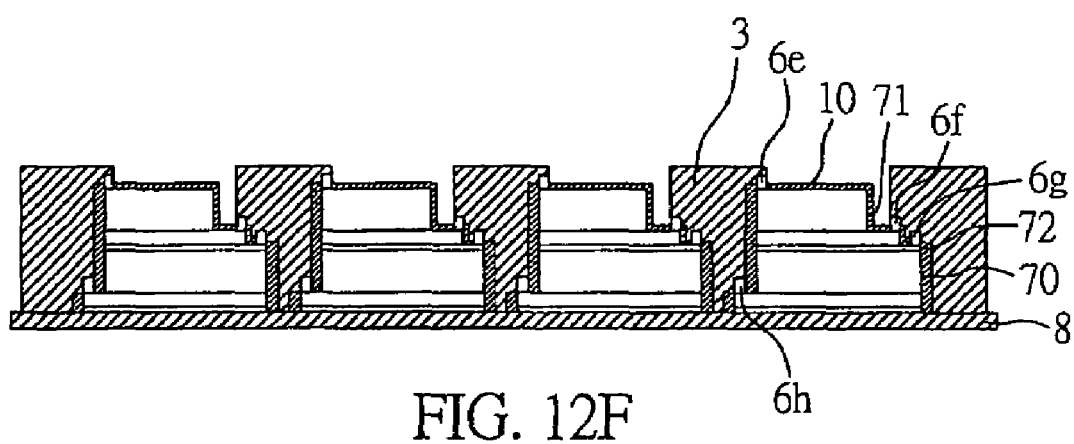

The present invention further provides a fabrication method for the alternating current light emitting device as shown in FIGS. 11A through 11E. To correspond with the aforementioned embodiments, the fabrication method thereof is exemplified by the drawing depicting two alternating current light emitting devices. Referring to FIG. 11A, the fabrication method comprises the steps of: preparing a substrate 1 and forming at least two active layers on the substrate in a chip-stacking manner (an upper active layer 200 and a lower active layer 201 as shown in the drawing), wherein the active layer is a connected p-type light emitting layer with a n-type light emitting layer that, collectively, are equivalent to the light emitting diode P/N structure, the p-type light emitting layer and the n-type light emitting layer are preferably implemented using P-InGaN and N-InGaN respectively. Subsequently, as shown in FIG. 11B, a plurality of openings 4 is formed on the active layer (upper active layer 200 and bottom active layer 201) by yellow light shadowing and etching techniques to expose the substrate 1. Then, as shown in FIG. 11C, the outer periphery of the active layer (upper active layer 200 and lower active layer 201) is covered by a protection layer 5 for preventing leakage of current, the protection layer 5 being composed of dielectric materials, such as $SiO_x$ or $SiN_x$, and so forth. Following that, as shown in FIG. 11D, a plurality of conductive terminals 6a, 6b, 6c, and 6d is formed through the protection layer 5 so as to electrically connect to the active layer (upper active layer 200 and lower active layer 201). Lastly, as shown in FIG. 11E, a plurality of conductive structures 3 is formed on the openings 4 to electrically connect to the active layers (upper active layer 200 and lower active layer 201) so as to enable them to take turns to emit light during the positive or negative half cycles of alternating current. As the application of substrate 1, the active layers (upper active layer 200 and lower active layer 201), and the conductive structure 3 mentioned in the fabrication method is same as those shown in FIGS. 2A, 2B, 3A, and 3B, therefore the description thereof will be omitted herein.

The plurality of conductive terminals 6a, 6b, 6c, and 6d is formed by means of steam-gilding and can be implemented using an Ohm electrode electrically connected to the active layers (upper active layer 200 and lower active layer 201) to form a micro diode 20, which can be implemented by having identical or different wavelengths as mentioned above.

Accordingly, FIGS. 12A through 12F illustrate a fabrication method of the alternating current light emitting device of the present invention using two alternating current light emitting devices in accordance with the aforementioned embodiments. The method comprises the steps of: preparing a first substrate (not shown), forming a first active layer 70 on the first substrate, and removing the first substrate; then, referring to FIG. 12A, the first active layer 70 is disposed on a second substrate 8, and, further referring to FIG. 12B, a second active layer 71 is formed on the first active layer 70 with a connection layer 72 formed between the first active layer 70 and the second active layer 71, the connection layer being made of conductive and non-conductor materials and is pervious to light; then, referring to FIG. 12C, a plurality of openings 9 is formed on the first active layer 70 and the second active layer 71 by yellow-light development and etching techniques so as to expose the second substrate 8; then, referring to FIG. 12D, a protective layer 10 is applied on top of the outer peripheral region of the first active layer 70 and the second active layer 71 to prevent leakage of electric current, the protective layer 10 being made of dielectric materials such as $SiO_x$, $SiN_x$ and so on; then, further referring to FIG. 12E, a plurality of conductive terminals 6e, 6f, 6g, and 6h is formed through the protective layer 10 to electrically connect to the first active layer 70 and the second active layer 71; lastly, referring to FIG. 12F, a plurality of conductive structures 3 is formed on the openings 9 to electrically connect to the first active layer 70 and the second active layer 71 so as to enable the structure to take turns to emit light via the positive or negative half cycles of alternating current. As the second substrate 8, active layers (the first active layer 70 and the second active layer 71) and the conductive structures 3 are substantially similar in structure to those embodiments described in FIGS. 2A, 2B, 3A, and 3B, thus they will not be further detailed herein.

Similarly, the plurality of conductive terminals 6e, 6f, 6g, and 6h is formed by the same steam-gilding technique as the foregoing method and is implemented using an Ohm electrode to electrically connect to the active layers (the first active layer 70 and the second active layer 71) to form a micro diode 20 that can have the same or different wavelengths.

In summary of the above, the alternating current light emitting device disclosed by the present invention is characterized in that each micro diode formed is comprised of at least two active layers (preferably two or three layers), such that each active layer of the micro diode can take turns to emit light during the positive or negative half cycles of alternating current, thereby possessing a full-scale and continuous light emitting characteristic. Furthermore, the structural application of the active layers disclosed by the present invention can be applied to different circuit configurations to achieve the optimal effect of mixing light and continuous light emission as required.

The present invention has been described using the foregoing exemplary preferred embodiments. All modifications and variations of equal functions without violating the principle and technology of the present invention should be included in the scope of the claims to be described below.

What is claimed is:

1. An alternating current light emitting device comprising:
    a substrate;
    a bridge light-emitting unit formed on the substrate including:
        a plurality of alternating current light emitting micro diodes wherein each alternating current light emitting micro diode has at least one active layer, active layers of a first group of the alternating current light emitting micro diodes being arranged on four peripheral arms of a bridge rectifier, active layers of a second group of the alternating current light emitting micro diodes being arranged on a connecting arm connecting first and second diagonally opposed corners of the bridge rectifier, and
        first and second unit conductive electrodes being disposed at third and fourth diagonally opposed corners of the bridge rectifier, respectively for connecting with alternating current; and
    a conductive structure electrically connected to each of the alternating current light emitting micro diodes so as to allow the active layers of the first group of the alternating current light emitting micro diodes to alternately emit light during positive and negative half cycles of alternating current and allow the active layers of the second group of the alternating current light emitting micro diodes to emit light during both positive and negative half cycles of alternating current.

2. The alternating current light emitting device of claim 1, wherein the first unit conductive electrode, the second unit conductive electrode and the active layers of the alternating current light emitting micro diodes are electrically coupled to each other for connecting with alternating current.

3. The alternating current light emitting device of claim 1 further comprising
    a plurality of the bridge light-emitting units,
    wherein the plurality of the bridge light-emitting units are electrically coupled to each other.

4. The alternating current light emitting device of claim 3, wherein the plurality of the bridge light-emitting units are arranged in a matrix.

5. The alternating current light emitting device of claim 1, wherein the substrate comprises an insulating substrate.

6. The alternating current light emitting device of claim 1, wherein each active layer of the alternating current light emitting micro diodes emits light of identical wavelengths.

7. The alternating current light emitting device of claim 1, wherein at least each of the second group of alternating current light emitting micro diodes has at least two active layers, each active layer emitting light of different wavelengths.

8. The alternating current light emitting device of claim 3 further comprising first and second matrix conductive electrodes, wherein the first and second conductive electrodes are electrically coupled to the plurality of the bridge light-emitting units for connecting with alternating current.

9. The alternating current light emitting device of claim 8, wherein the first and second matrix conductive electrodes are disposed at first and second diagonally opposed corners of the matrix respectively.

* * * * *